(12) United States Patent
Wakimoto et al.

(10) Patent No.: US 7,462,911 B2
(45) Date of Patent: Dec. 9, 2008

(54) INSULATED GATE SEMICONDUCTOR DEVICE

(75) Inventors: Hiroki Wakimoto, Nagano (JP); Seiji Momota, Nagano (JP); Masahito Otsuki, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 176 days.

(21) Appl. No.: 11/561,652

(22) Filed: Nov. 20, 2006

(65) Prior Publication Data

US 2007/0075331 A1    Apr. 5, 2007

Related U.S. Application Data

(62) Division of application No. 10/993,146, filed on Nov. 19, 2004, now Pat. No. 7,151,297.

(30) Foreign Application Priority Data

Nov. 20, 2003  (JP)  .............................. 2003-390433
Jul. 30, 2004   (JP)  .............................. 2004-224777

(51) Int. Cl.
*H01L 29/76*  (2006.01)
*H01L 29/94*  (2006.01)
*H01L 31/062* (2006.01)
*H01L 31/113* (2006.01)
*H01L 31/119* (2006.01)

(52) U.S. Cl. ....................... 257/330; 257/331
(58) Field of Classification Search .................. 257/330
See application file for complete search history.

(56) References Cited

U.S. PATENT DOCUMENTS

2001/0054738 A1    12/2001  Momota et al.

FOREIGN PATENT DOCUMENTS

| JP | 09-331063 A | 12/1997 |
|---|---|---|
| JP | 2000-228519 A | 8/2000 |
| JP | 2001-308327 A | 11/2001 |
| JP | 2002-16252 A | 1/2002 |
| JP | 2002-100770 A | 4/2002 |

OTHER PUBLICATIONS

S. Momota et al.; "Analysis on the Low Current Turn-on Behavior of IGBT Module"; ISPSD 2000; May 22-25, Toulouse, France; 2000 IEEE; pp. 359-362.

Office action issued in corresponding Chinese application no. 2004100887007, dated Jul. 25, 2008; partial translation provided.

*Primary Examiner*—Thien F Tran
(74) *Attorney, Agent, or Firm*—Rossi, Kimms & McDowell LLP.

(57) ABSTRACT

A trench IGBT is disclosed which meets the specifications for turn-on losses and radiation noise. It includes a p-type base layer divided into different p-type base regions by trenches. N-type source regions are formed in only some of the p-type base regions. There is a gate runner in the active region of the trench IGBT. Contact holes formed in the vicinities of the terminal ends of the trenches and on both sides of the gate runner electrically connect some of the p-type base regions that do not include source regions to an emitter electrode. The number N1 of p-type base regions that are connected electrically to the emitter electrode and the number N2 of p-type base regions that are insulated from the emitter electrode are related with each other by the expression $25 \leq \{N1/(N1+N2)\} \times 100 \leq 75$.

6 Claims, 13 Drawing Sheets

INSULATED GATE SEMICONDUCTOR DEVICE

CROSS REFERENCE TO RELATED APPLICATIONS

This application is a divisional of U.S. application Ser. No. 10/993,146, filed Nov. 19, 2004, which claims priority from application Serial No. JP 2003-390433 filed on Nov. 20, 2003 and JP 2004-224777, filed on Jul. 30, 2004, and the contents of these documents are incorporated herein by reference in their entirety.

BACKGROUND OF THE INVENTION

A. Field of the Invention

The present invention relates generally to insulated gate semiconductor devices and, more particularly, to trench-type insulated gate bipolar transistors (hereinafter referred to as "trench IGBTs"), which include an insulated gate structure in the trenches formed in a semiconductor substrate.

B. Description of the Related Art

Recently, trench IGBTs have been attracting much attention in the field of power devices used for electric power converters. Since the trench IGBT facilitates increased trench density, the voltage drop $V_{CE(sat)}$ in the ON-state of the trench IGBT is small and the steady state losses are reduced. However, since the capacitance between the gate electrode and the emitter electrode, and the capacitance between the gate electrode and the collector electrode (hereinafter referred to as the "gate-collector capacitance"), are large, large switching losses are caused by the turning-on and turning-off of the trench IGBT.

It has been reported that the tradeoff relation between the saturation voltage and the turn-off losses in the trench IGBT is reduced by disposing p-type well regions not in electrical contact with the emitter electrode to increase the accumulated carrier density on the emitter electrode side (cf. JP P2000-228519A at page 4, left-hand column, last line). Trench IGBTs including p-type well regions not in electrical contact with the emitter electrode also have been disclosed in JP P2001-308327A (FIGS. 1 and 7), JP PHei.9(1997)-331063A (FIG. 42), JP P2002-100770A (FIG. 22), and JP P2002-16252A (FIG. 1).

FIG. 18 is a top plan view schematically showing a trench IGBT having a structure as described above. FIG. 19 is a cross-sectional view of the trench IGBT along the line segment A-A of FIG. 18. In FIG. 18, p-type base regions 9 and 10, n-type source regions 3, gate electrodes 5, and gate runners 13 and 14 are shown. Gate insulator films 4, interlayer insulator films 6, and emitter electrode 7 are not shown in FIG. 18. In FIG. 19, the cross section along the line segment A-A, that is, the structure across n-type source regions 3 and gate electrodes 5, is shown together with the constituent elements not shown in FIG. 18.

As shown in FIGS. 18 and 19, n-type drift layer 2 is on p-type collector layer 1 and p-type base layer 20 is on n-type drift layer 2. P-type base layer 20 is divided into p-type base regions 9 and 10 by trenches 21. N-type source region 3 is on the side of trench 21 in narrow p-type base region 9. An n-type source region 3 is not disposed in wide p-type base region 10.

Emitter electrode 7 is in contact with n-type source regions 3 and p-type base region 9. Emitter electrode 7 is insulated by interlayer insulator film 6 from p-type type base region 10 including no n-type source region 3. Trench 21 is filled with gate electrode 5 with gate insulator film 4 interposed between them. As shown in FIG. 18, gate electrodes 5 are connected electrically to gate runners 13 extending across the terminal ends of trenches 21. Gate runners 13 are connected to a gate pad (not shown).

In the above-described structure including only gate runners 13 across both ends of trenches 21, the gate electrode resistance between gate runners 13 and the center of the active region, in which the main current of the semiconductor device is made to flow, increases as the chip size increases. To obviate this problem, gate runners 14 are disposed in the active region with a spacing of between 2 and 4 mm. Although not shown in the figures, a structure for sustaining the breakdown voltage including guard rings and such means is disposed around the active region.

FIG. 20 is a top plan view schematically showing the other conventional trench IGBT. FIG. 21 is a cross sectional view of the other trench IGBT along the line segment B-B of FIG. 20. In the trench IGBT shown in FIGS. 20 and 21, p-type base layer 20 is divided into p-type base regions 9 and 12 by trenches 21. Emitter electrode 7 is in contact also with p-type base region 12, not including any p-type source region therein, via contact holes 11 formed through interlayer insulator film 6 (cf JP P2001-308327A). Contact hole 11 is 2 μm×2 μm in cross sectional area, and is disposed near the terminal end of trench 21.

In FIG. 20, p-type base regions 9 and 12, n-type source regions 3, gate electrodes 5, gate runners 13 and 14, and contact holes 11 projected to the surfaces of p-type base regions 12 are shown. Gate insulator films 4, interlayer insulator films 6, and emitter electrode 7 are not shown in FIG. 20. In FIG. 21, the cross section along the line segment B-B of FIG. 20, that is the structure across n-type source regions 3, gate electrodes 5 and contact holes 11, is shown together with the constituent elements not shown in FIG. 20.

By optimizing the surface structure including trenches 21, that is by optimizing the surface structure including gate electrodes 5, it is possible for the trench IGBTs described above to realize low steady state losses and low switching losses (high speed switching) simultaneously. The trench IGBT, having the structure described in FIG. 21, facilitates preventing the breakdown voltage from decreasing as compared with the trench IGBT having the structure described in FIG. 19.

When the chip size for any of the trench IGBTs described above is so large that it is necessary to dispose gate runner 14 in the active region, the result is a large gate-collector capacitance across the boundaries between p-type base regions 10 or 12 not including any source region 3 and gate insulator films 4 in the central part of the active region. Since the voltage drop speed and the current increase speed become slow in the turning-on of the trench IGBTs due to the large gate-collector capacitance, large turn-on losses are caused. For preventing the turn-on losses from increasing, it is necessary to improve the gate-voltage change-over capabilities of the switching devices for gate driving or the ICs for gate driving. Therefore, it is impossible to use the conventional devices for gate driving.

Recently, it has been required to reduce the radiation noise caused by switching for power devices. To reduce the radiation noise, it is necessary to reduce the voltage drop speed (dV/dt) and the current increase speed (di/dt). Therefore, it is hard to reduce the radiation noises and the switching losses simultaneously. Since a tradeoff exists between the turn-on losses and the radiation noise as described above, it is impossible for the trench IGBTs having any of the conventional structures to obtain an optimum structure that meets the specifications for turn-on losses and radiation noise.

It has been reported that the device characteristics exhibited by the IGBT turning on at a low current of about one-tenth the rated current greatly affects radiation noise (S. Momota, et al. "Analysis on the Low Current Turn-On Behavior of IGBT Modules," *Proc. ISPSD*2000, 359-362 (2000)). Tremendous efforts are necessary to suppress the radiation noise caused, especially that in the frequency range of 30 MHz or higher below the reference level. It has been reported that radiation noise is caused in the frequency range of 30 MHz or higher by a high (dV/dt) containing high frequency components. To suppress the (dV/dt) in the switching of an inverter below the reference value, the gradient of the main current ($dI_c/dt$) is suppressed at a low value by adjusting the gate resistance and such parameters.

However, high gate resistance increases the turn-on losses of the IGBT. FIG. 11 is a wave chart describing the simulation results for comparing the turn-on characteristics of the IGBT shown in FIG. 8 and the conventional IGBTs with the gate resistance values thereof changed. As shown in FIG. 11, the gradient (di/dt) of the current during the turn-on of the IGBT (hereinafter referred to as the "turn-on current-change-speed") is reduced by increasing the gate resistance. Although the gate resistance increase is preferable to reduce the radiation noise, switching losses increase, since the gate resistance increase causes long tails in the voltage waveforms. Therefore, it is preferable for the trench IGBT to realize a low (di/dt) while suppressing the gate resistance as low as possible.

In view of the foregoing, it would be desirable to obviate the problems described above. It would be also desirable to provide an insulated gate semiconductor device that facilitates meeting the specifications on the turn-on losses and the switching noises simultaneously. The present invention is directed to overcoming or at least reducing the effects of one or more of the problems set forth above.

SUMMARY OF THE INVENTION

According to a first aspect of the invention, there is provided an insulated gate semiconductor device including a first semiconductor layer of a first conductivity type; a second semiconductor layer of a second conductivity type on the first semiconductor layer; a third semiconductor layer of the first conductivity type on the second semiconductor layer; and trenches formed through the third semiconductor layer down to the second semiconductor layer. The third semiconductor layer is divided into multiple semiconductor regions by the trenches. Fourth semiconductor layers of the second conductivity type selectively are formed at least in the surface portions of some of the semiconductor regions. A control electrode is formed in each of the trenches with an insulator film interposed therebetween. There is a runner on the third semiconductor layer in the active region, therein the semiconductor device makes a current flow. There is an insulator film interposed between the runner and the third semiconductor layer, with the runner being connected electrically to the control electrodes. There is a first main electrode on the third and fourth semiconductor layers with an interlayer insulator film interposed therebetween, and a second main electrode is connected electrically to the first semiconductor layer. The first main electrode is in contact with the third semiconductor layer and the fourth semiconductor layers in the semiconductor regions, including the fourth semiconductor layers formed therein, through the interlayer insulator film. The first main electrode also is in electrical contact with the third semiconductor layer in some of the semiconductor regions, not including any fourth semiconductor layer, via contact holes formed in the vicinities of the terminal ends of the trenches and in the vicinities of the runner through the interlayer insulator film.

According to the first aspect of the invention, the first main electrode contacts, in the vicinities of the runner disposed in the active region, with some of the semiconductor regions formed by dividing the third semiconductor layer, but not including any fourth semiconductor layer therein. This configuration facilitates reducing the gate-collector capacitance caused across the boundaries between the third semiconductor layer in the semiconductor regions not including any fourth semiconductor layer and the insulator films in the trenches and increasing the voltage drop speed and the current increase speed during the turn-on of the device. Therefore, the turn-on losses are reduced.

Advantageously, the other semiconductor regions, not including any fourth semiconductor layer, excluding the some of the semiconductor regions, not including any fourth semiconductor layer but in contact with the first main electrode, are insulated from the first main electrode by the interlayer insulator film.

The semiconductor regions, formed by dividing the third semiconductor layer by the trenches and contacting only with the first main electrode electrically, and the semiconductor regions, formed by dividing the third semiconductor layer by the trenches and insulated from the first main electrode, are arranged appropriately so that the turn-on losses and the radiation noise may be reduced.

Advantageously, the number N1 of the some of the semiconductor regions, not including any fourth semiconductor layer but in contact with the first main electrode, and the number N2 of the other semiconductor regions, not including any fourth semiconductor layer but insulated from the first main electrode, are related with each other by the relational expression $0.25 \leq N1/(N1+N2) \leq 0.75$. By setting the numbers N1 and N2 such that these conditions are met, the turn-on losses and the radiation noise are reduced.

According to a second aspect of the invention, there is provided an insulated gate semiconductor device including a first semiconductor layer of a first conductivity type, a second semiconductor layer of a second conductivity type on the first semiconductor layer, and a third semiconductor layer of the first conductivity type on the second semiconductor layer. Trenches are formed through the third semiconductor layer down to the second semiconductor layer, the third semiconductor layer being divided by the trenches at least into first semiconductor regions, second semiconductor regions, and third semiconductor regions. Fourth semiconductor layers of the second conductivity type selectively are formed at least in the surface portions of the first semiconductor regions. A control electrode is formed in each of the trenches with an insulator film interposed therebetween. A runner is on the third semiconductor layer in the active region, therein the semiconductor device makes a current flow, and there is an insulator film interposed between the runner and the third semiconductor layer, the runner being connected electrically to the control electrodes. A first main electrode is on the third and fourth semiconductor layers with an interlayer insulator film interposed between them, and a second main electrode is connected electrically to the first semiconductor layer. The first main electrode is in contact with the third semiconductor layer and the fourth semiconductor layers through the interlayer insulator film in the first semiconductor regions. The first main electrode is in contact with the third semiconductor layer only via contact holes formed through the interlayer insulator film in the second semiconductor regions, and the contact holes are formed in the vicinities of the terminal ends of the trenches and in the vicinities of the runner. The first main electrode is insulated from the third semiconductor layer and the fourth semiconductor layers by the interlayer insulator film in the third semiconductor regions.

In the configuration described above, the first main electrode contacts with the third semiconductor layer only via the contact holes in the vicinities of the runner disposed in the active region and in the vicinities of the terminal ends of the trenches. This configuration facilitates reducing the gate-collector capacitance caused across the boundaries between the third semiconductor layer and the insulator films in the trenches and increasing the voltage drop speed and the current increase speed during the turn-on of the device. Therefore, the turn-on losses are reduced.

Advantageously, the number N1 of the second semiconductor regions and the number N2 of the third semiconductor regions are related with each other by the relational expression $0.25 \leq N1/(N1+N2) \leq 0.75$. By setting the numbers N1 and N2 such that these conditions are satisfied, the turn-on losses and the radiation noise are reduced.

According to a third aspect of the invention, there is provided an insulated gate semiconductor device including a first semiconductor layer of a first conductivity type, a second semiconductor layer of a second conductivity type on the first semiconductor layer, and a third semiconductor layer of the first conductivity type on the second semiconductor layer. Trenches are formed through the third semiconductor layer down to the second semiconductor layer, dividing the third semiconductor layer into at least into relatively narrow semiconductor regions and relatively wide semiconductor regions. Fourth semiconductor layers of the second conductivity type selectively are formed at least in the surface portions of the relatively narrow semiconductor regions. A control electrode is formed in each of the trenches with an insulator film interposed therebetween. A first main electrode is on the third and fourth semiconductor layers with an interlayer insulator film interposed therebetween, and a second main electrode connects electrically to the first semiconductor layer. The first main electrode is in contact with the third semiconductor layer and the fourth semiconductor layers through the interlayer insulator film in the relatively narrow semiconductor regions. The third semiconductor layer is connected electrically to the first main electrode via resistance of 50 mΩ or higher in the relatively wide semiconductor regions.

Advantageously, the resistance is the sheet resistance of an impurity layer in the relatively wide semiconductor region, and the impurity layer is connected electrically to the first main electrode via contact holes formed locally through the interlayer insulator film. Also, it is preferable to shape the trenches as respective stripes extending in parallel to each other and the contact holes are aligned along the stripe-shaped trenches with spacing between 200 μm and 2 mm. In a preferred embodiment, the resistance is made of doped polysilicon.

Since the above described advantageous configurations reduce di/dt by low gate resistance, the turn-on losses and the radiation noises are reduced. The insulated gate semiconductor device according to the invention facilitates reducing the turn-on losses and the radiation noises. Therefore, an insulated gate semiconductor device having a structure that meets the specifications for turn-on losses and radiation noise is obtained according to the invention.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
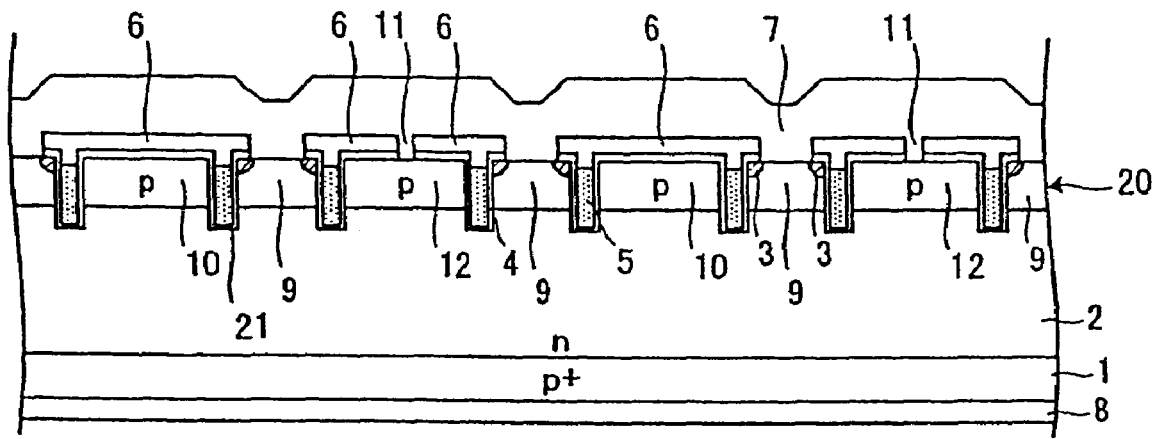
FIG. 1 is a cross sectional view schematically showing a trench IGBT according to a first embodiment of the invention.

Now the invention will be described in detail hereinafter with reference to the accompanied drawing figures which illustrate the preferred embodiments of the invention. Throughout these figures, the same reference numerals are used to designate the same constituent elements and their duplicated descriptions are omitted for the sake of simplicity. Although the first conductivity type is a p-type and the second conductivity type is an n-type in the following descriptions, the present invention is applicable to trench IGBTs in which the first conductivity type is an n-type and the second conductivity type is a p-type.

First Embodiment

Figure 3:
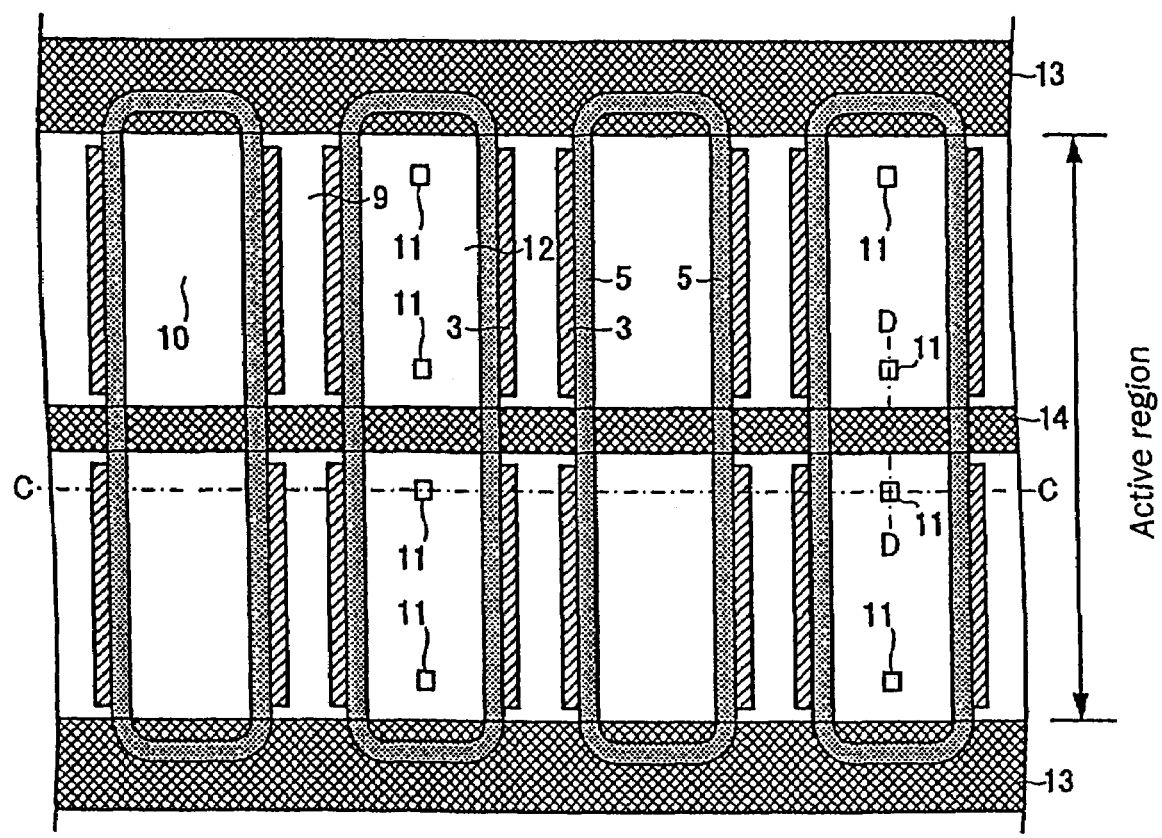
FIG. 3 is a top plan view schematically showing the trench IGBT according to the first embodiment of the invention.

FIG. 3 is a top plan view schematically showing a trench IGBT according to a first embodiment of the invention. In FIG. 3, p-type base regions 9, 10, and 12, n-type source regions 3, gate electrodes 5, gate runners 13 and 14, and contact holes 11 projected to the surfaces of p-type base regions 12 are shown. Gate insulator films 4, interlayer insulator films 6, and emitter electrode 7 are not shown in FIG. 3.

Figure 2:
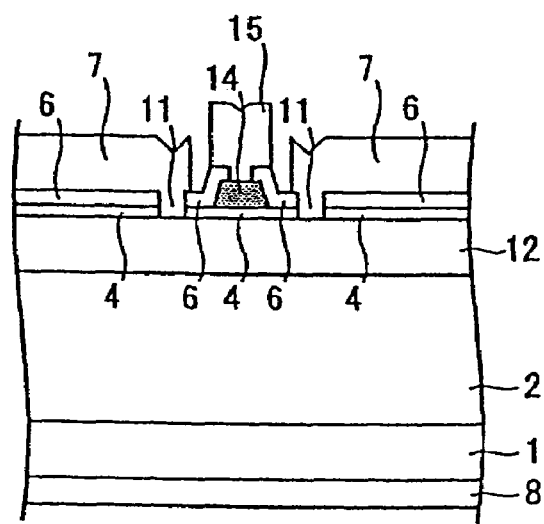
FIG. 2 is another cross sectional view of the trench IGBT according to the first embodiment of the invention.

FIG. 1 is a cross-sectional view along the line segment C-C of FIG. 3 across n-type source regions 3, gate electrodes 5, and contact holes 11 in the vicinity of gate runner 14 in the active region. FIG. 2 is a cross sectional view along the line segment D-D of FIG. 3 across gate runner 14 in the active region and contact holes 11 on both sides of gate runner 14. In FIGS. 1 and 2, the constituent elements not shown in FIG. 3 are shown.

As shown in FIGS. 1 through 3, n-type drift layer 2 (a second semiconductor layer) is on p-type collector layer 1 (a first semiconductor layer). P-type base layer 20 is a third semiconductor layer and is on n-type drift layer 2. P-type base layer 20 is divided by trenches 21 into first, second, and third p-type base regions 9, 12, and 10.

First p-type base regions 9 include n-type source regions 3 and 3, which are fourth semiconductor layers. In other words, n-type source region 3 is in the surface portion of p-type base region 9 on the side of trench 21. N-type source region 3 is formed neither in second p-type base region 12 nor in third p-type base region 10.

Emitter electrode 7, that is a first main electrode, is in contact commonly with first p-type base regions 9 and n-type source regions 3 in first p-type base regions 9. Emitter electrode 7 only is in contact with second p-type base regions 12 via contact holes 11 formed through interlayer insulator films 6. Third p-type base regions 10 are insulated from emitter electrode 7 by interlayer insulator films 6. Trench 21 is filled with gate electrode 5, working as a control electrode, with interlayer insulator film 6 and gate insulator film 4 interposed between them. Collector electrode 8, that is a second main electrode, is in contact with the back surface of p-type collector layer 1.

As shown in FIG. 3, gate electrodes 5 are connected electrically to gate runners 13 and 13 extending across the end portions of trenches 21. Gate runner 13 is made of the same material as the material of gate electrode 5, such as polysilicon, the resistance of which is lowered by impurity doping. Gate electrodes 5 are connected electrically to gate runner 14 extending across trenches 21 in the active region of the device. Gate runners 13 and 14 are connected electrically to a gate pad (not shown).

As shown in FIG. 2, gate runner 14 arranged in the active region is insulated from second p-type base regions 12 by insulator films 4. Although not illustrated, gate runner 14 arranged in the active region is insulated from first and third p-type base regions 9 and 10 by insulator films 4. Although not illustrated, gate runner 14 is connected electrically to gate electrodes 5 at the respective cross points thereof.

As shown in FIGS. 2 and 3, contact holes 11 for connecting emitter electrode 7 and second p-type base regions 12 electrically to each other are arranged on both sides of gate runner 14 in the active region and in the vicinities of the terminal ends of trenches 21. In the structure shown in FIG. 2, gate runner wiring 15 is disposed, for example, in contact with gate runner 14. Gate runner wiring 15 is disposed when the resistance of gate electrodes 5 is not low enough. Gate runner wiring 15 and emitter electrode 7 are formed by pattering the same wiring layer. Although not illustrated, a structure for sustaining the breakdown voltage including guard rings and such means is disposed around the active region. The active region is the portion that functions as a transistor.

The phrase "terminal ends of the trenches" includes various shapes in addition to those exemplified in the drawings, i.e., stripes having no connection with one another and all stripes having a connection with one another. More particularly, the gate electrode 5 under gate runner 13 is not necessarily located in the trench. It is necessary only that the gate runner 13 and the gate electrode 5 be electrically connected with each other. Thus, the phrase "terminal ends of the trenches" more particularly refers to the terminal ends of the long sides of the active region.

Now the preferable ratio of the number of second p-type base regions 12 connected electrically to emitter electrode 7 and the number of third p-type base regions 10 insulated from emitter electrode 7 will be described below. The number N1 of second p-type base regions 12 and the number N2 of third p-type base regions 10 are related by the expression $25 \leq \{N1/(N1+N2)\} \times 100 \leq 75$ In other words, the preferable ratio of second p-type base regions 12 is from 25% to 75% of the total number (N1+N2) of second and third p-type base regions 12 and 10. Hereinafter, the ratio $\{N1/(N1+N2)\}$ is referred to as the "short circuit rate." It is preferable to set the short circuit rate between 25% and 75%.

When one second p-type base region 12 is arranged with respect to three third p-type base regions 10, the short circuit rate is 25%. When three second p-type base regions 12 are arranged with respect to one third p-type base region 10, the short circuit rate is 75%. In FIGS. 1 and 3, the short circuit rate is 50%.

Figure 4:
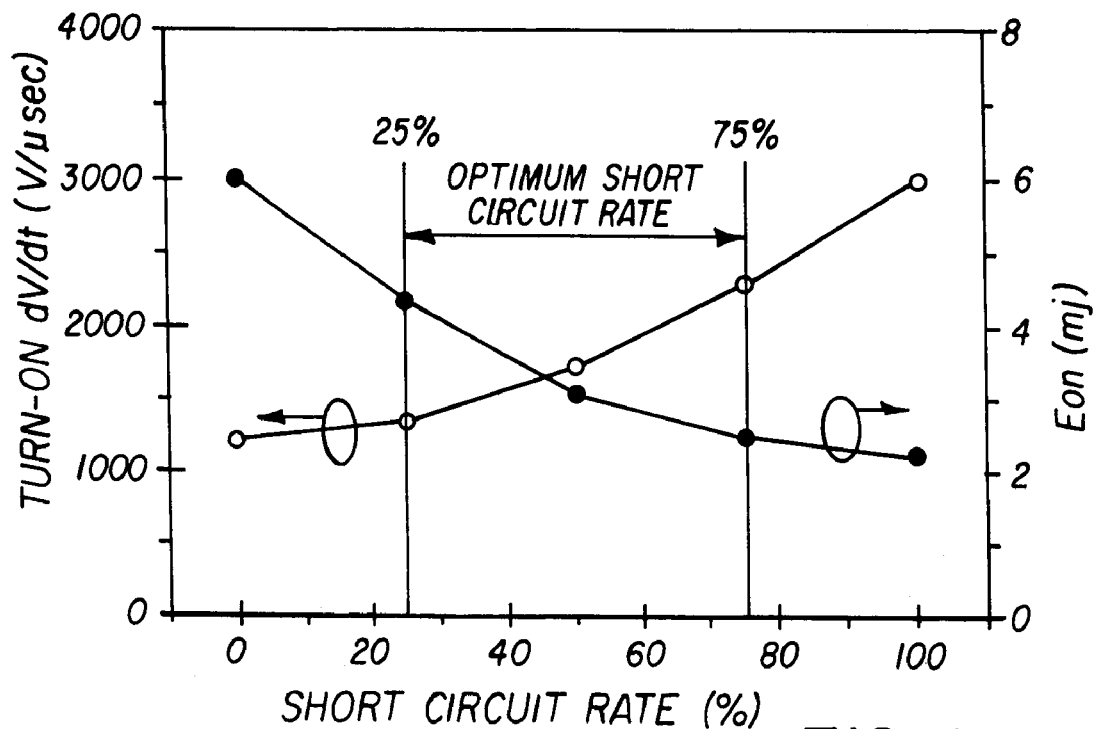
FIG. 4 is a pair of curves relating the turn-on losses and the voltage change speed during the turn-on of the device with the short circuit rate.

Now the reason why it is preferable to set the short circuit rate between 25% and 75% will be described below with reference to FIGS. 4 and 5. FIG. 4 is a pair of curves relating the turn-on losses (Eon) and the voltage change speed (dV/dt) during the turn-on of the device (hereinafter referred to as the "turn-on voltage-change-speed") with the short circuit rate. Referring now to FIG. 4, the voltage change speed increases with increasing short circuit rate, and the turn-on losses become lower with increasing short circuit rate.

Figure 5:
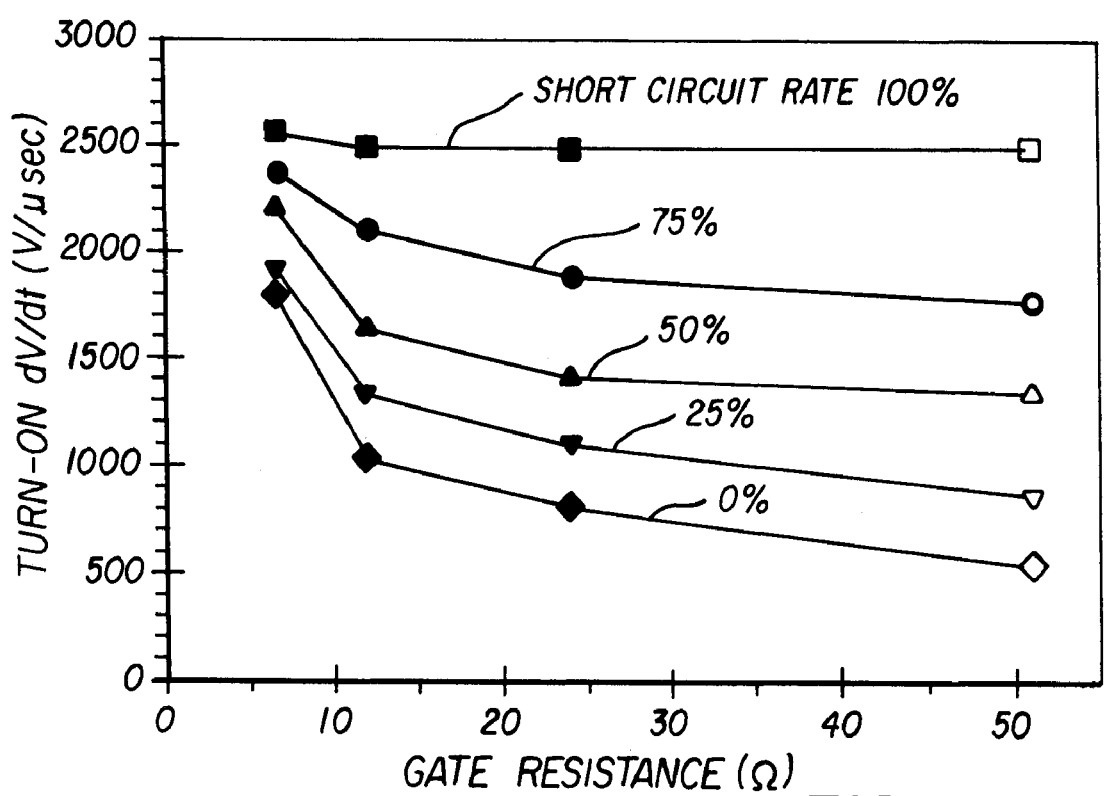
FIG. 5 is a set of curves relating the voltage change speed during the turn-on of the device with the gate resistance with the short circuit rate as a parameter.

FIG. 5 is a set of curves relating the turn-on voltage-change-speed (dV/dt) with the gate resistance with the short circuit rate as a parameter. It has been reported that the magnitude of the radiation noise is affected by the turn-on voltage-change-speed and the turn-on current-change-speed. Since the voltage change speed and the current change speed become high and low in synchrony with each other, the voltage change speed will be used below as the characteristics representing the magnitude of the radiation noises.

Referring now to FIG. 4, when the short circuit rate is between 0 and 25%, the turn-on losses increase sharply with decreasing short circuit rate and the lowering of the turn-on voltage-change-speed that affects the radiation noise greatly is small. To suppress the turn-on losses to a low level, it is necessary to improve the gate-voltage change-over capabilities of the switching devices for gate driving or the ICs for gate driving as described in connection with the problems of the conventional trench IGBTs. The gate driving capabilities of the conventional devices for gate driving are not enough. Therefore, the short circuit rate between 0 and 25% is not preferable.

When the short circuit rate is between 75 and 100%, the turn-on voltage-change-speed rises sharply with increasing short circuit rate and the reduction of the turn-on losses is small. As described in FIG. 5, the turn-on voltage-change-speed does not become as small as the short circuit rate approaches 100%, even when a high gate resistance is used. Since it is impossible to confine the radiation noise within the specified range, the short circuit rate between 75 and 100% is not preferable. Therefore, the short circuit rate between 25 and 75% is preferable.

Since emitter electrode 7 and second p-type base regions 12 are connected electrically to each other not only in the vicinities of trenches 21, but also on both sides of gate runner 14 in the central part of the active region, the gate-collector capacitance is reduced in the entire p-type base regions 12 surrounded by the respective trenches 21 in the central part of the active region. Therefore, the speed of voltage drop during the turn-on of the IGBT (hereinafter referred to as the "turn-on voltage-drop-speed") becomes high and the turn-on losses are reduced according to the first embodiment of the invention.

By setting the short circuit rate between 25 and 75%, an IGBT having an optimum structure that facilitates meeting the specifications on the turn-on losses and radiation noise is obtained according to the first embodiment of the invention. Therefore, the problem of insufficient gate driving capabilities of the conventional switching devices for gate driving or the conventional ICs for gate driving and the problem of the radiation noise outside the specified range are prevented.

Second Embodiment

Figure 6:
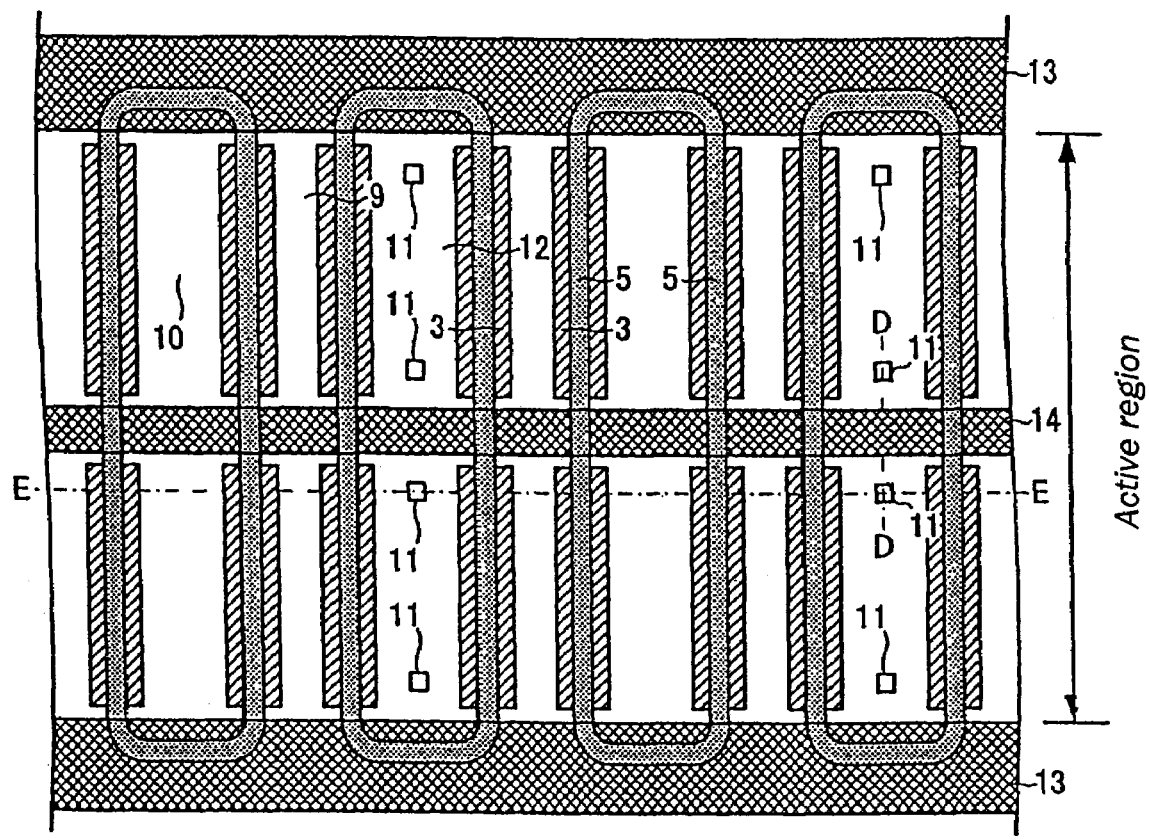
FIG. 6 is a top plan view schematically showing a trench IGBT according to a second embodiment of the invention.
Figure 7:
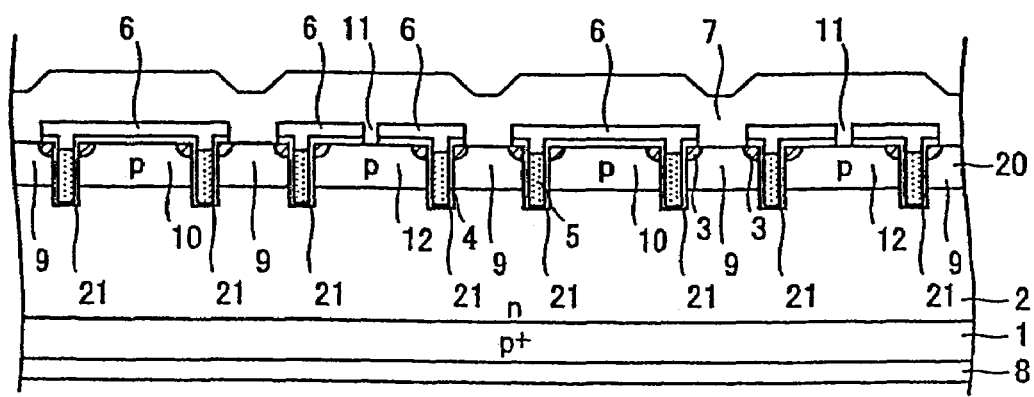
FIG. 7 is a cross sectional view of the trench IGBT according to the second embodiment of the invention.

FIG. 6 is a top plan view schematically showing a trench IGBT according to a second embodiment of the invention. FIG. 7 is a cross sectional view along the line segment E-E of FIG. 6 across contact holes 11 aligned along a side of gate runner 14.

In the trench IGBT according to the first embodiment (shown in FIG. 1), n-type source regions 3 are formed only in first p-type base regions 9. To facilitate this, the position of the mask for forming n-type source regions 3 and the position of the mask for forming trenches 21 must be set very precisely relative to each other. In order to relax the required mask positioning precision and improve the mass-production efficiencies, it is effective to widen n-type source regions 3. In FIGS. 6 and 7, n-type source regions 3 are widened and formed on both sides of trenches 21. This configuration facilitates distributing n-type source regions 3 uniformly over the active region and reducing the complication of not forming n-type source regions 3 in some p-type base regions.

Although n-type source regions 3 are formed in third p-type base region 10, n-type source regions 3 in third p-type base region 10 do not function as sources, since n-type source regions 3 in third p-type base region 10 are insulated from emitter electrode 7 by interlayer insulator film 6. Although n-type source regions 3 are formed also in second p-type base region 12, n-type source regions 3 in second p-type base region 12 do not function as sources, since second p-type base region 12 is in contact with emitter electrode 7 via contact holes 11, but n-type source regions 3 in second p-type base region 12 are not in contact with emitter electrode 7. The trench IGBT according to the second embodiment of the invention exhibits the same effects as the trench IGBT according to the first embodiment.

Third Embodiment

Figure 8:
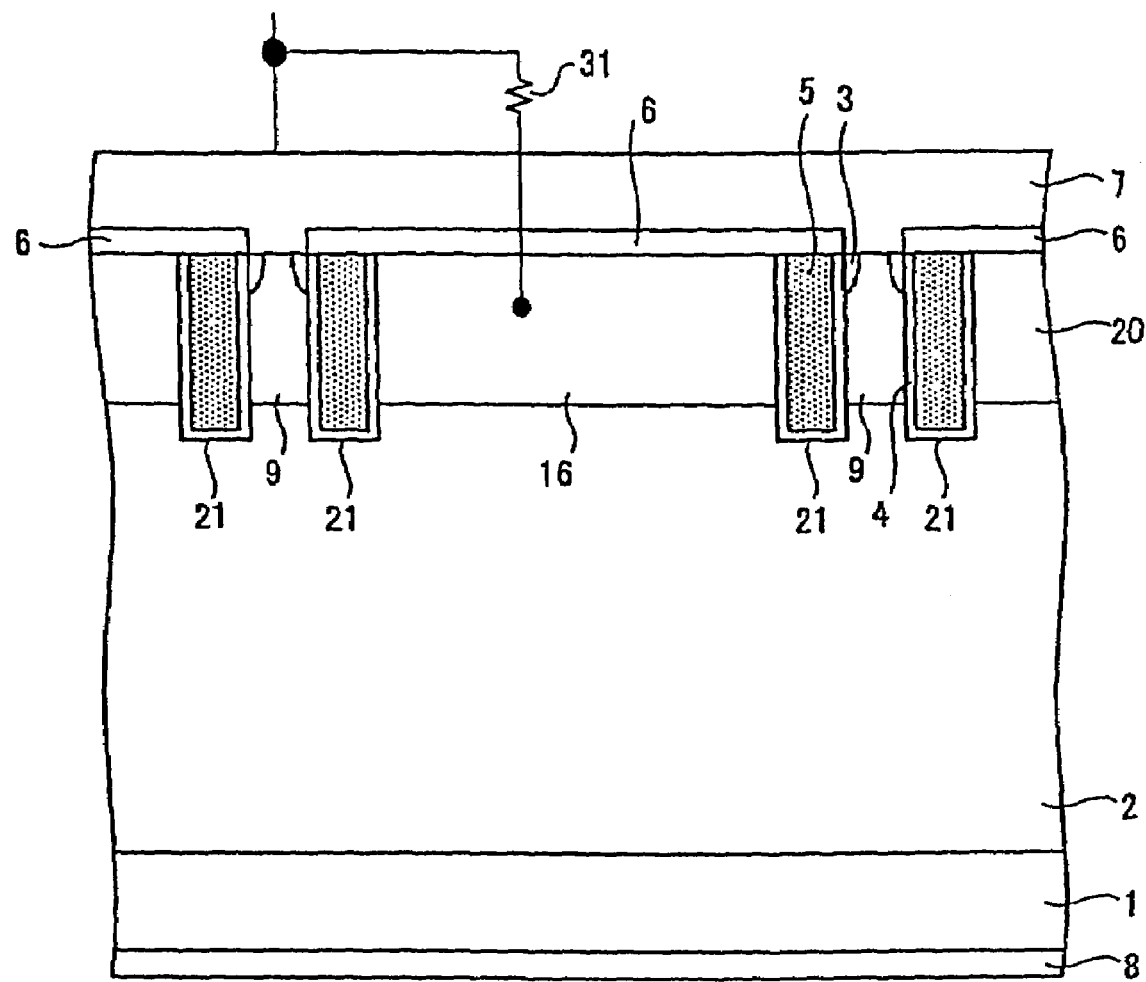
FIG. 8 is a cross sectional view for describing the principle of a trench IGBT according to a third embodiment of the invention.

FIG. 8 is a cross sectional view for describing the principle of a trench IGBT according to a third embodiment of the invention. Referring now to FIG. 8, p-type base layer 20 is divided into relatively narrow p-type base regions 9 and relatively wide p-type base regions 16 wider than relatively narrow p-type base regions 9. Relatively wide p-type base region 16 is connected electrically to emitter electrode 7 via gate resistance 31 of 50 mΩ or higher. Emitter electrode 7 is in contact commonly with n-type source regions 3 (in relatively narrow p-type base regions 9) and relatively narrow p-type base region 9 in the same manner as in the trench IGBT according to the first embodiment.

Figure 9:
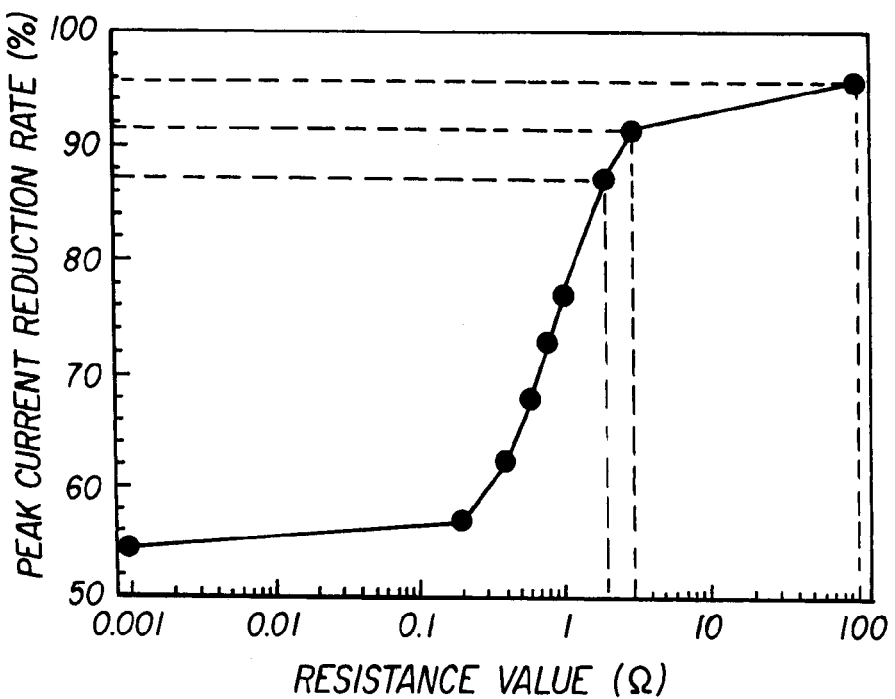
FIG. 9 is a graph describing the simulated relation between the peak current reduction rate and the resistance value in the trench IGBT having the structure shown in FIG. 8.

FIG. 9 is a graph describing the simulated relation between the peak current reduction rate and the value of gate resistance 31 in the trench IGBT having the structure shown in FIG. 8. When the peak current value in the structure which insulates relatively wide p-type base regions 16 from emitter electrode 7 (which is identical to the conventional structure shown in FIG. 19) is set at 100 and when it is necessary to adjust the peak current value at 90% of the peak current value or lower in the conventional structure, it is effective, as FIG. 9 indicates, to set the value of gate resistance 31 at 2Ω or lower. For adjusting the peak current value at 92% of the peak current value or lower in the conventional structure, it is effective to set the value of gate resistance 31 at 3Ω or lower. For adjusting the peak current value at 96% of the peak current value or lower in the conventional structure, it is effective to set the value of gate resistance 31 at 100Ω or lower.

Figure 10:
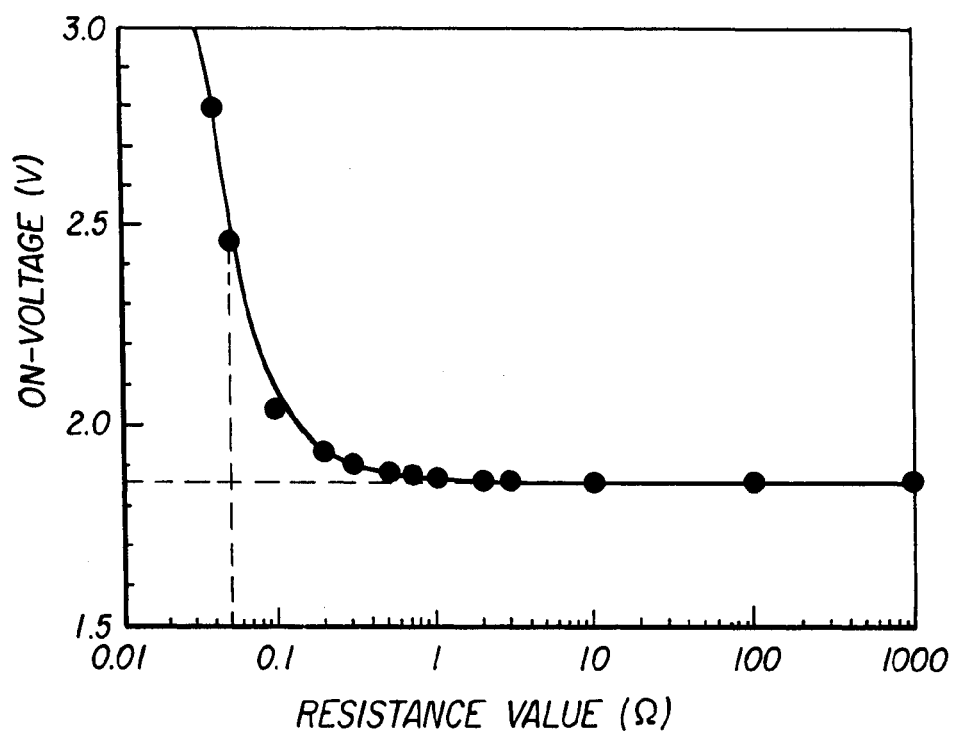
FIG. 10 is a graph describing the simulated relation between the on-voltage and the resistance value in the trench IGBT having the structure shown in FIG. 8.

FIG. 10 is a graph describing the simulated relation between the on-resistance and the value of gate resistance 31 in the trench IGBT having the structure shown in FIG. 8. Referring now to FIG. 10, the on-voltage is 2.5 V or lower when the value of gate resistance 31 is 50 mΩ or higher. As the value of gate resistance 31 exceeds 50 mΩ to the lower side, the on-voltage exceeds 2.5 V to the higher side, causing a steady state loss increase. Therefore, the value of gate resistance 31 of 50 mΩ or lower is not practical. Therefore, the value of gate resistance 31 is preferably 50 mΩ or higher and 100Ω or lower, more preferably 50 mΩ or higher and 3Ω or lower, and most preferably 50 mΩ or higher and 2Ω or lower.

Figure 11:
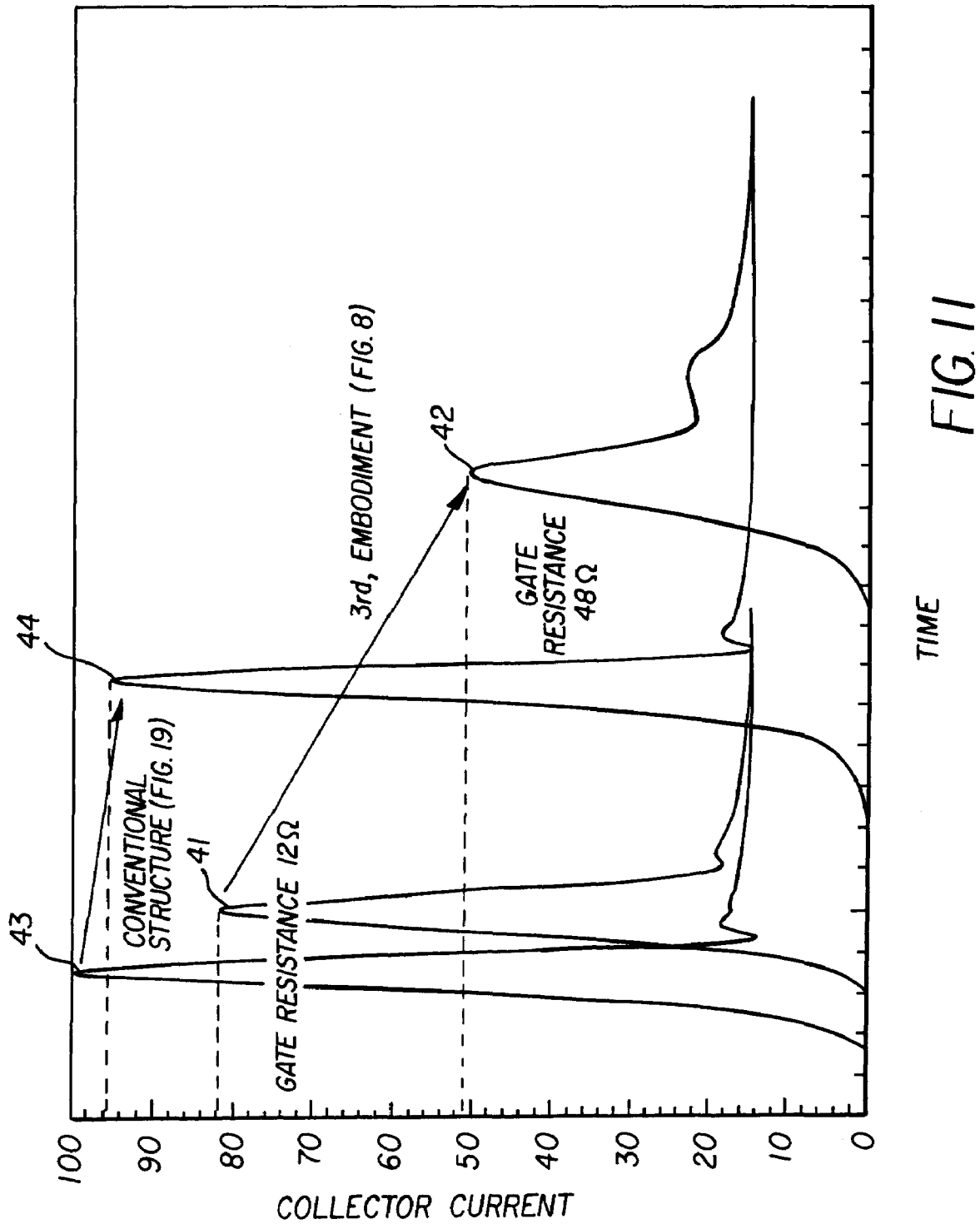
FIG. 11 is a wave chart showing the results of simulations for comparing the turn-on characteristics of the IGBT shown in FIG. 8 and the conventional IGBTs with the gate resistance values thereof changed.

FIG. 11 is a wave chart describing the simulations results for comparing the turn-on characteristics of the trench IGBTs, in which the value of gate resistance 31 is set at 400 mΩ. As designated by the reference numerals 41 and 42 in FIG. 11, the peak current value during the turn-on (hereinafter referred to as the "turn-on peak-current-value") of the trench IGBT having the structure shown in FIG. 8 is 81 A for the gate resistance set at 12Ω and 51 A for the gate resistance set at 48Ω. Therefore, the turn-on peak-current-value of the trench IGBT is lowered greatly by changing the gate resistance value from 12Ω to 48Ω. In this case, the peak current reduction rate is about 37%.

Figure 19:
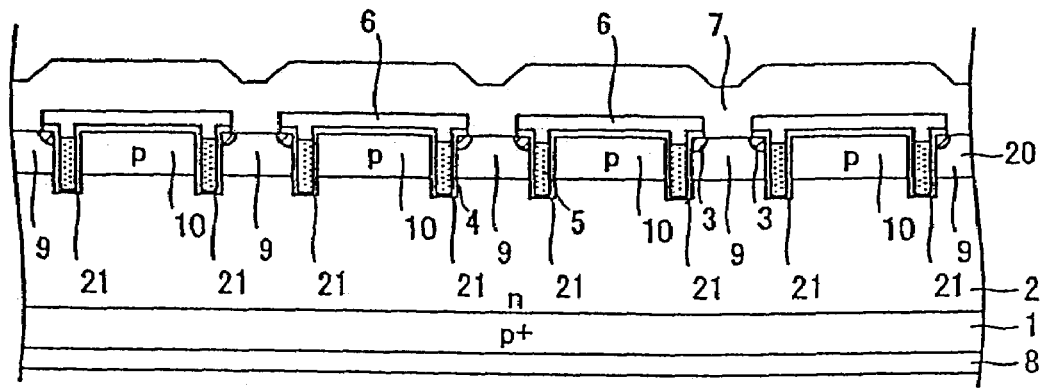
FIG. 19 is a cross sectional view of the conventional trench IGBT along the line segment A-A of FIG. 18.
Figure 20:
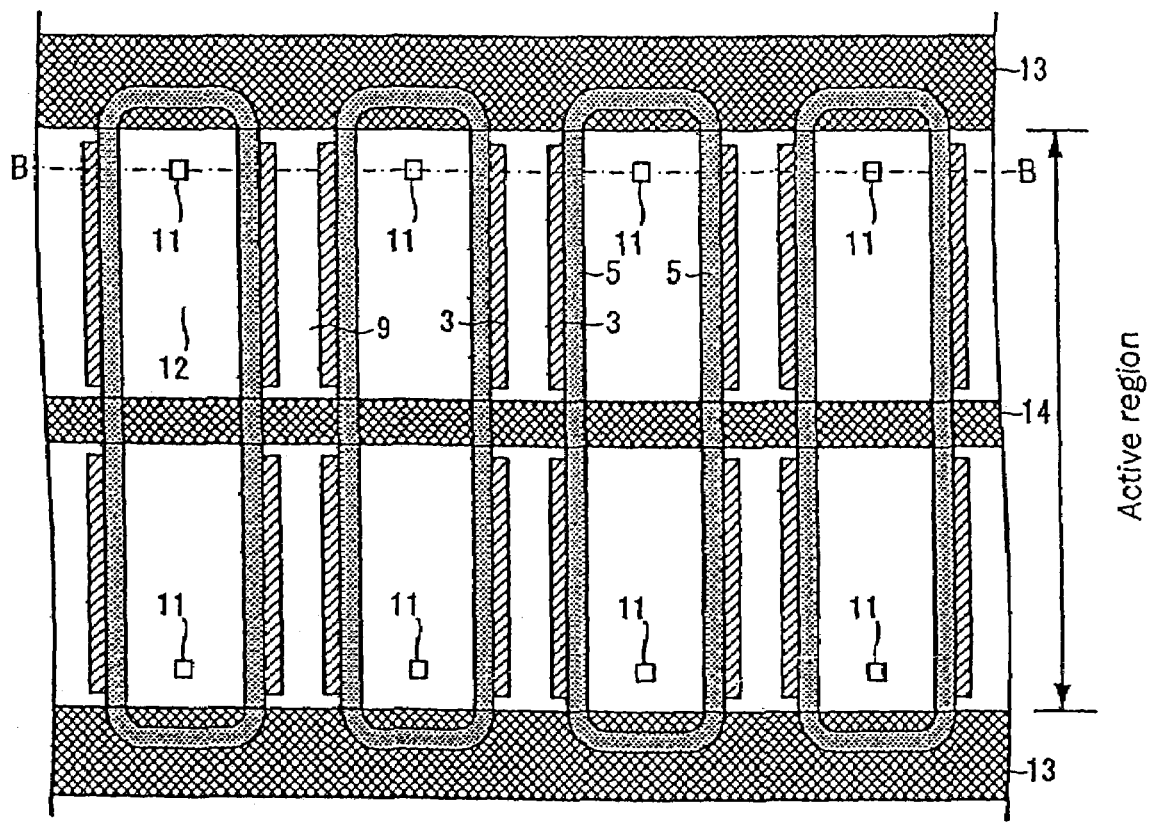
FIG. 20 is a top plan view schematically showing the other conventional trench IGBT.
Figure 21:
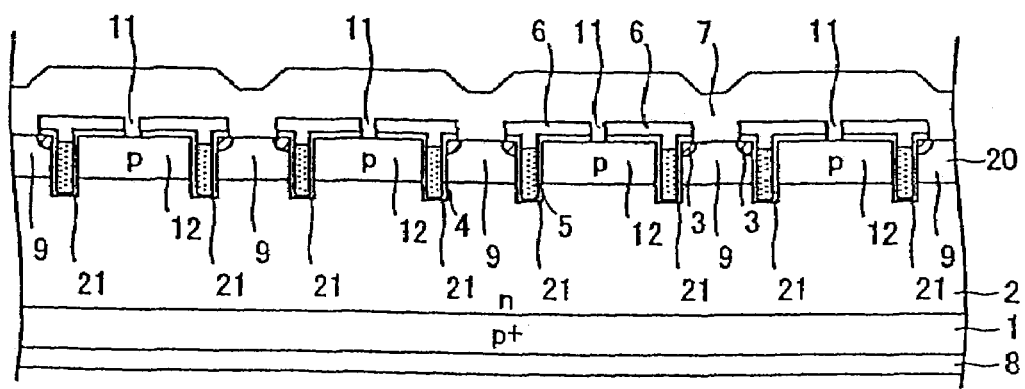
FIG. 21 is a cross sectional view of the other trench IGBT along the line segment B-B of FIG. 20.

As designated by the reference numerals 43 and 44 in FIG. 11, the turn-on peak-current-value of the trench IGBT having the conventional structure shown in FIG. 19 is 100 A for the gate resistance 31 set at 12Ω and 95 A for the gate resistance 31 set at 48Ω. In this case, the peak current reduction rate is about 5%. Since the turn-on peak-current-value is lowered greatly according to the third embodiment as described above, the switching losses are reduced according to the third embodiment.

The turn-on peak-current-value is almost proportional to the turn-on current-change-speed (di/dt). In other words, as the peak current value is higher, the turn-on current-change-speed is higher. As the peak current value is lower, the turn-on current-change-speed is slower. Since the peak current changing rate with respect to the gate resistance 31 change is larger according to the third embodiment than that according to the prior art, a low current-change-speed is realized by the gate resistance 31 lower than that employed in the trench IGBTs according to the prior art. Therefore, radiation noise in the switching of the trench IGBT is reduced.

Figure 12:
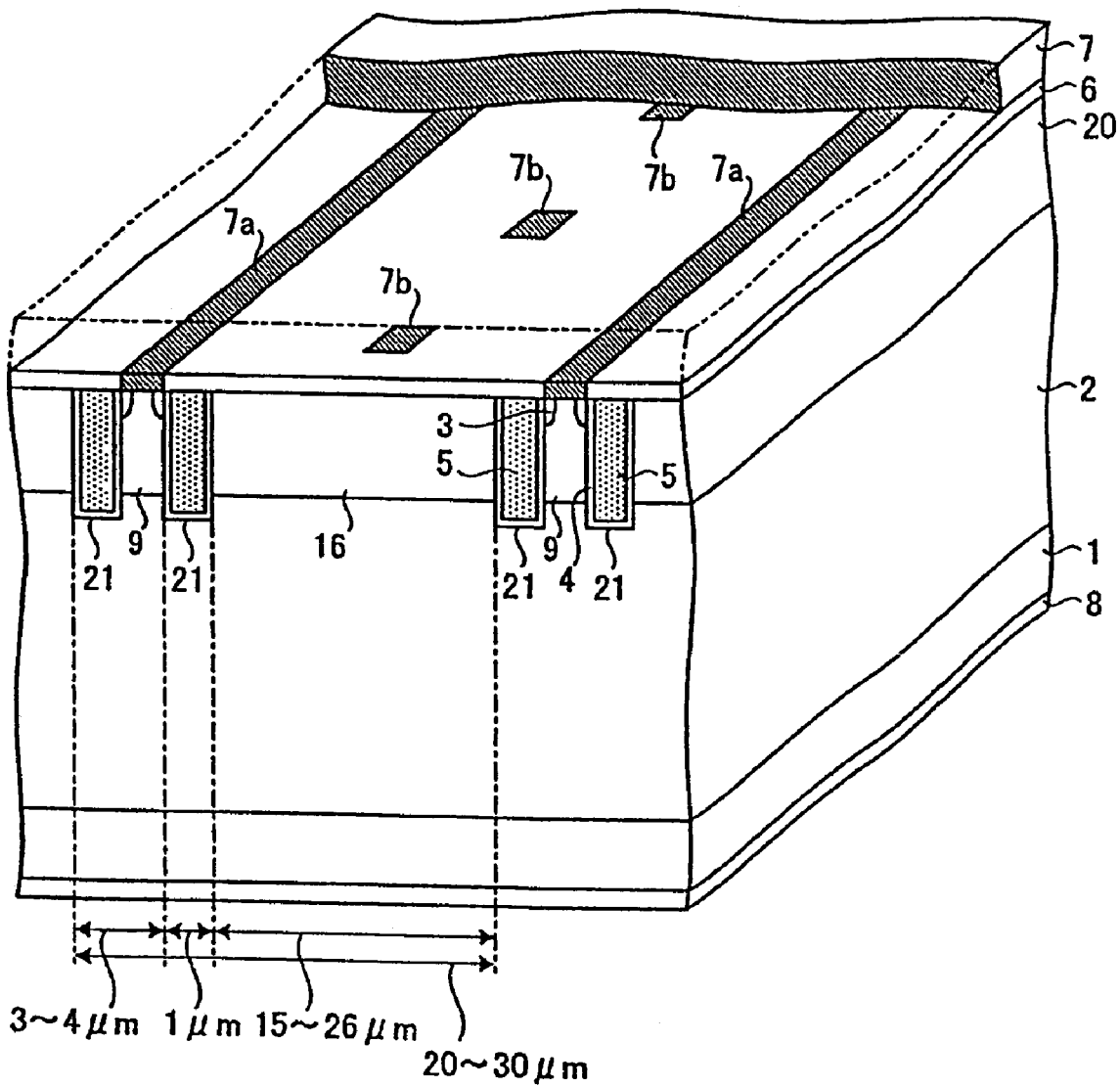
FIG. 12 is a perspective view schematically showing the structure of the trench IGBT according to the third embodiment of the invention.

Now gate resistance 31 is described in detail below. FIG. 12 is a perspective view schematically showing the structure of the trench IGBT that employs the sheet resistance of an impurity layer in relatively wide p-type base region 16 for gate resistance 31 for connecting relatively wide p-type base region 16 to emitter electrode 7. In the trench IGBT including stripe-shaped trenches 21, contact sections 7a, in which relatively narrow p-type base regions 9 and emitter electrode 7 contact with each other, are formed continuously along respective p-type base regions 9. Relatively wide p-type base region 16 is connected electrically to emitter electrode 7 via contact holes 7b formed through interlayer insulator film 6. Contact holes 7b are filled with the metal sputtered for forming emitter electrode 7.

Although not limited specifically, contact hole 7b is about several $\mu m^2$ in area, e.g. 5 $\mu m^2$. Contact holes 7b are aligned along the stripe of trench 21 with a spacing that is between 200 μm and 2 mm. Simply by changing a part of the mask pattern for forming the etching mask used for etching interlayer insulator film 6, contact holes 7b can be formed simultaneously with sputtering interlayer insulator film 6 for forming contact sections 7a. In other words, the trench IGBT according to the third embodiment is manufactured through a manufacturing process that is the same as the manufacturing process by which a conventional trench IGBT is manufactured.

Figure 13:
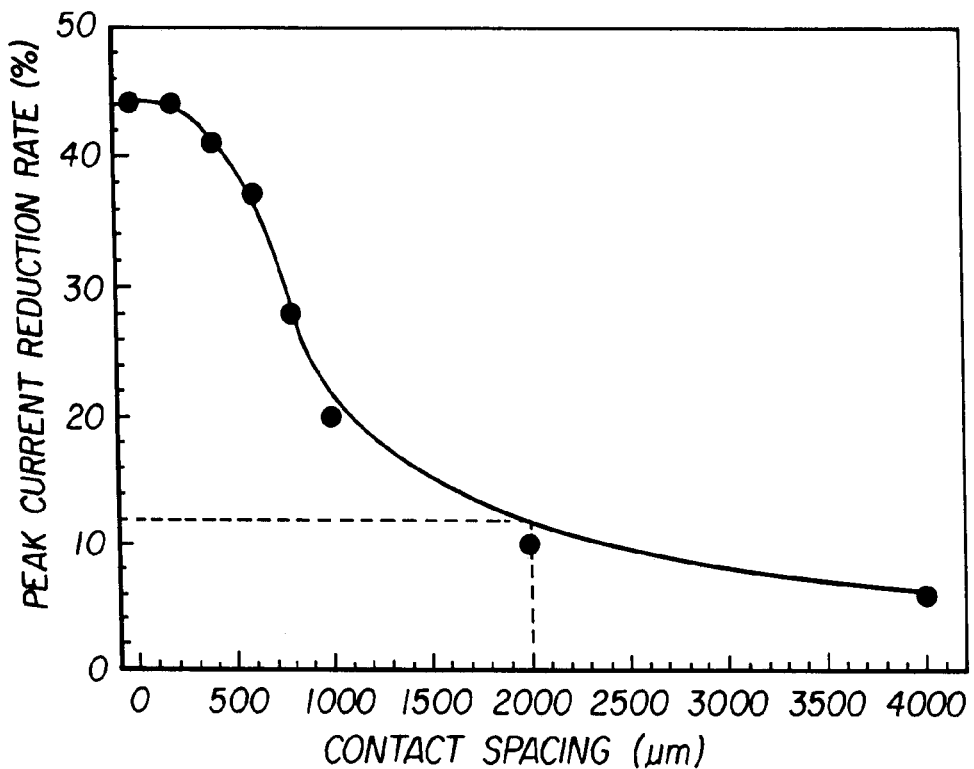
FIG. 13 is a graph describing the experimental results relating the contact hole spacing and the peak current reduction rate in the trench IGBT having the structure shown in FIG. 12.

FIG. 13 is a graph describing the experimental results that relates the spacing between contact holes 7b to the peak current reduction rate in the trench IGBT having the structure shown in FIG. 12. The vertical axis of FIG. 13 represents the difference between the turn-on peak-current-values of the trench IGBT shown in FIG. 12 for the gate resistance values of 12Ω and 48Ω. As FIG. 13 indicates, the peak-current reduction-rate is 10% or larger for a spacing between contact holes 7b of 2 mm or narrower. Thus, the characteristics of the trench IGBT are improved remarkably as compared to the characteristics of the conventional trench IGBT (the peak current reduction rate of around 5%).

Figure 14:
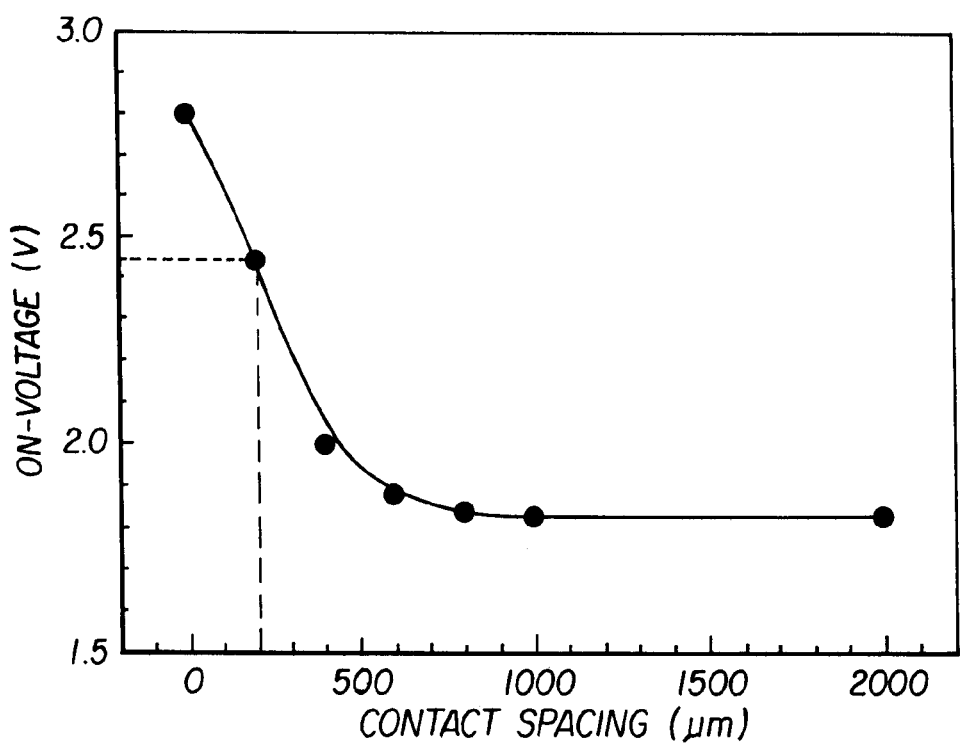
FIG. 14 is a graph describing the experimental results relating the contact hole spacing and the on-voltage in the trench IGBT having the structure shown in FIG. 12.

FIG. 14 is a graph describing the experimental results relating the spacing between contact holes 7b and the on-voltage in the trench IGBT having the structure shown in FIG. 12. As FIG. 14 indicates, the spacing between contact holes 7b of narrower than 200 μm is not practical, since the on-voltage exceeds 2.5 V toward the higher side at the contact hole spacing of narrower than 200 μm. Therefore, it is effective to set the spacing between the contact holes 7b between 200 μm and 2 mm. For example, the spacing between contact holes 7b is 500 μm for the trench IGBT exhibiting a breakdown voltage of the 1200 V class. The spacing between contact holes 7b is 1000 μm for the trench IGBT exhibiting a breakdown voltage of the 1700 V class.

The dimensions and the impurity concentrations in the trench IGBT having the structure shown in FIG. 12 are described below. The breakdown voltage class is from 600 to 3300 V. As described in FIG. 12, the unit cell width is from 20 to 30 μm. Trench 21 is 1 μm in width. The pitch between two trenches 21 and 21 sandwiching relatively narrow p-type base region 9 is from 3 to 4 μm. The spacing between two trenches 21 and 21 sandwiches relatively wide p-type base region 16, that is the width of relatively wide p-type base region 16 is from 15 to 26 μm. The impurity concentration in relatively wide p-type base region 16 is from $10^{16}$ cm$^{-3}$ to $10^{18}$ cm$^{-3}$ and preferably $10^{17}$ cm$^{-3}$.

Fourth Embodiment

Figure 15:
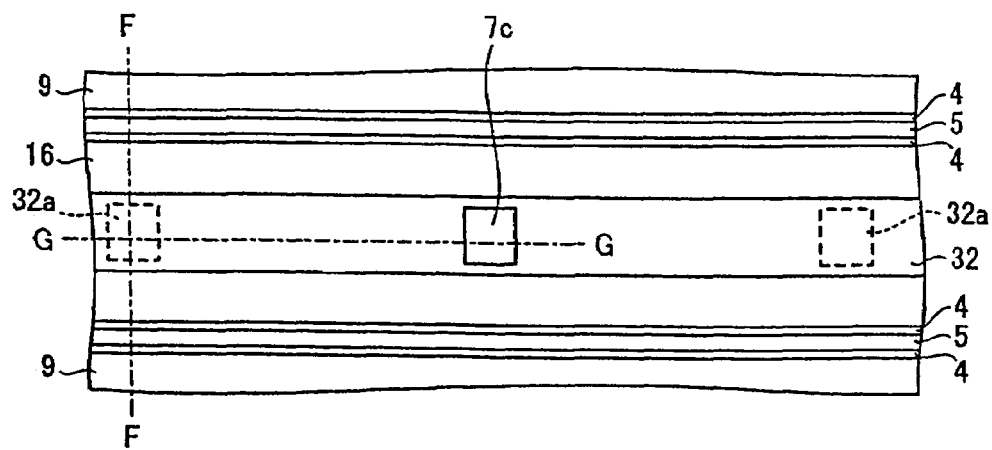
FIG. 15 is a top plan view of a trench IGBT according to a fourth embodiment of the invention.
Figure 16:
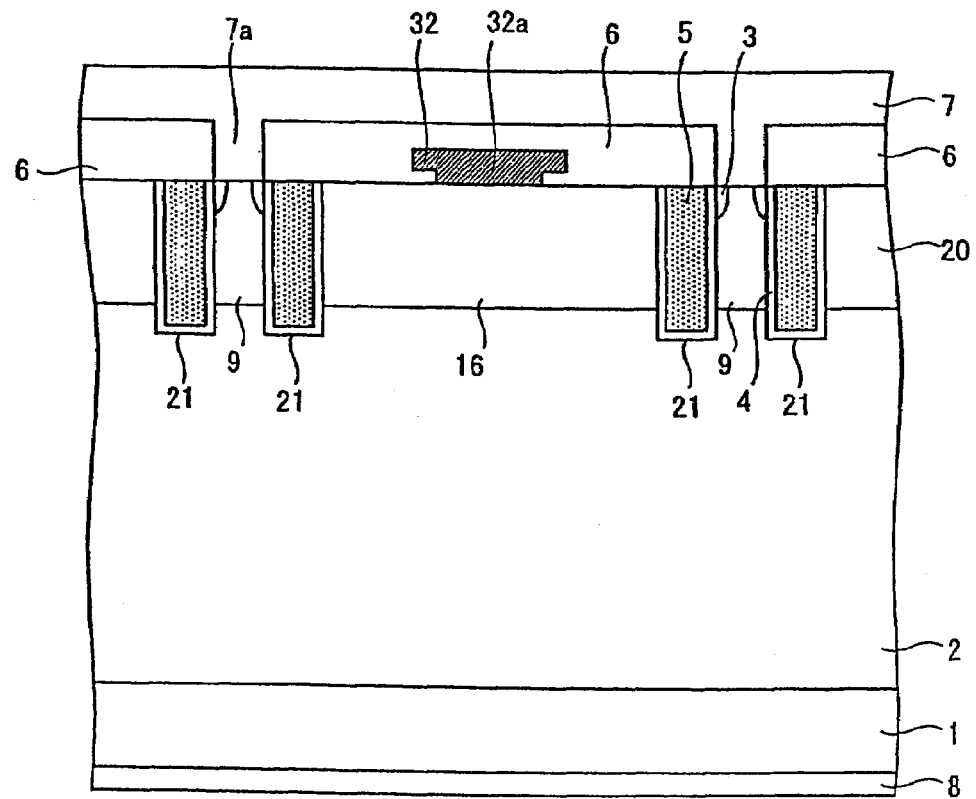
FIG. 16 is a cross sectional view of the trench IGBT according to the fourth embodiment.
Figure 17:
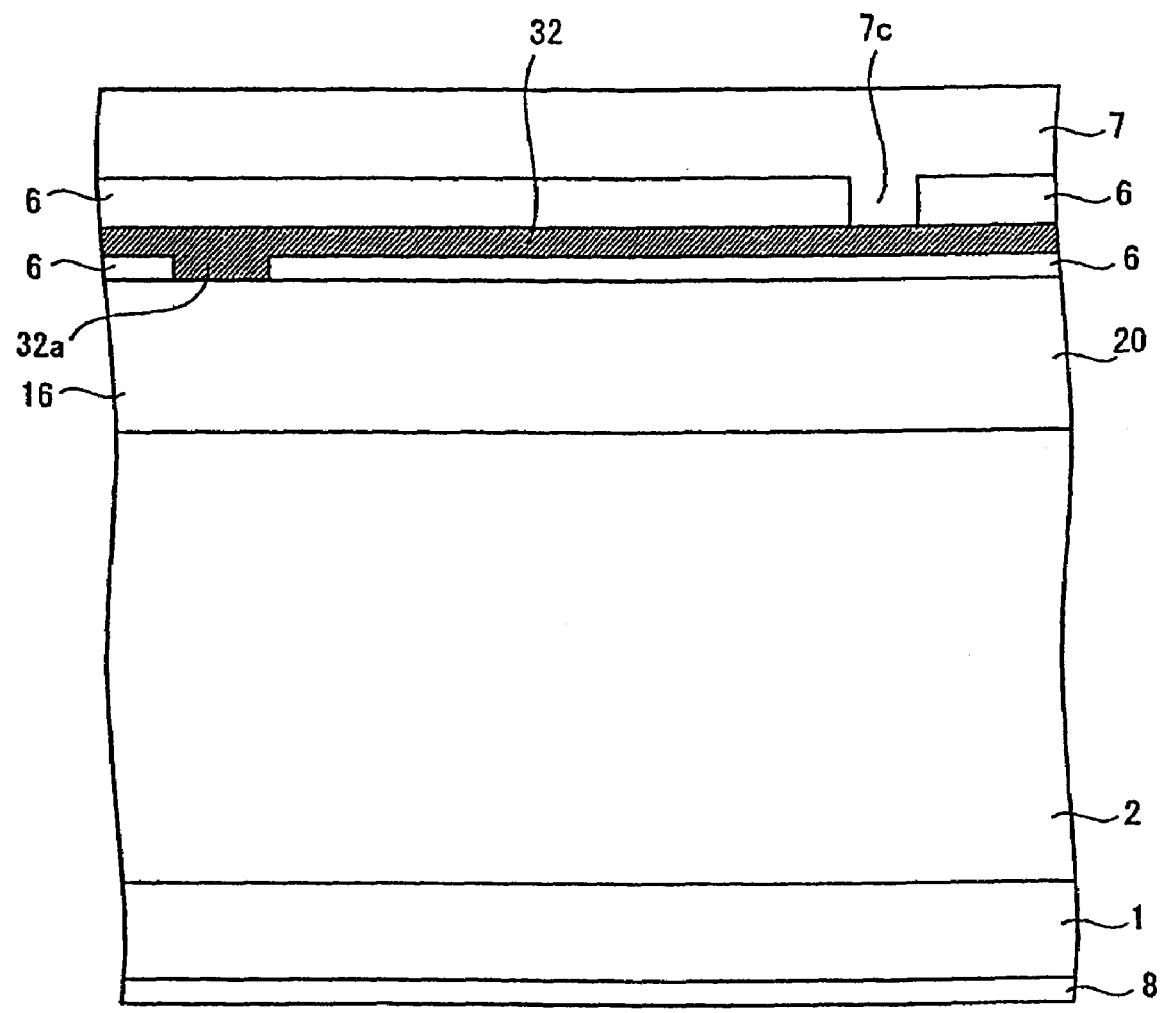
FIG. 17 is another cross sectional view of the trench IGBT according to the fourth embodiment.
Figure 18:
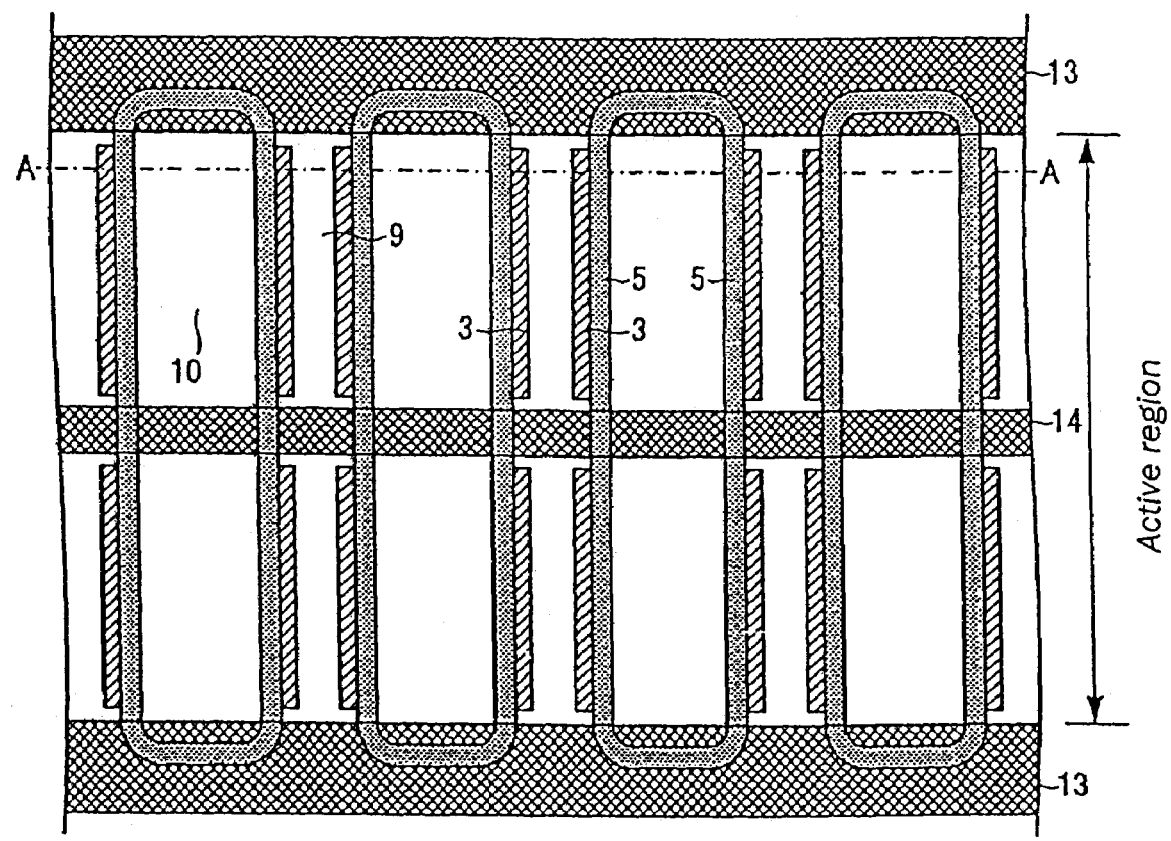
FIG. 18 is a top plan view schematically showing a conventional trench IGBT.

FIG. 15 is a top plan view of a trench IGBT according to the fourth embodiment of the invention. FIG. 16 is a cross sectional view along the line segment F-F of FIG. 15 across relatively wide p-type base region 16 and a contact section (hereinafter referred to as a "first contact section") 32a, in which relatively wide p-type base region 16 and a doped polysilicon layer 32 contact each other. FIG. 17 is a cross sectional view along the line segment G-G of FIG. 15 across first contact section 32a and a contact section (hereinafter referred to as a "second contact section") 7c, in which emitter electrode 7 and doped polysilicon layer 32 contact each other. According to the fourth embodiment, gate resistance 31 connecting relatively wide p-type base region 16 with emitter electrode 7 is made of a doped polysilicon layer 32.

In FIG. 15, p-type base regions 9 and 16, gate insulator films 4, gate electrodes 5, doped polysilicon layer 32, first contact sections 32a and second contact section 7c projected to the surface of doped polysilicon layer 32 are shown. Interlayer insulator films 6 and emitter electrode 7 are not shown in FIG. 15. The constituent elements not shown in FIG. 15 are shown in FIGS. 16 and 17.

Doped polysilicon layer 32 is disposed above relatively wide p-type base region 16 and shaped with a stripe extending along trenches 21. Doped polysilicon layer 32 is isolated from relatively wide p-type base region 16 and emitter electrode 7 by interlayer insulator film 6 but connected electrically to relatively wide p-type base region 16 via first contact sections 32a. Doped polysilicon layer 32 is connected to emitter electrode 7 via second contact section 7c. The value of gate resistance 31 shown in FIG. 8 is controlled by the distance between first and second contact sections 32a and 7c, the width of doped polysilicon layer 32, and the impurity concentration in doped polysilicon layer 32. The trench IGBT according to the fourth embodiment exhibits the same effects as the trench IGBT according to the third embodiment exhibits. Gate resistance 31 can be built in the trench IGBTs without employing any multilayered metal wiring structure.

Thus, a trench IGBT has been described according to the present invention. In the IGBTs according to the embodiments of the invention, changes and modifications are obvious to those skilled in the art without departing from the true spirit of the invention. For example, multiple gate runners 14 may be disposed in the active region in the IGBT according to the first embodiment or the second embodiment. In this case, contact holes 11 may be formed on both sides of each gate runner 14 in second p-type base region 12 and second p-type base region 12 and emitter electrode 7 may be connected electrically via contact holes 11.

The trench IGBTs according to the invention are useful in the field of power devices used for electric power converters.

What is claimed is:
1. An insulated gate semiconductor device comprising:
a first semiconductor layer of a first conductivity type;
a second semiconductor layer of a second conductivity type on the first semiconductor layer;
a third semiconductor layer of the first conductivity type on the second semiconductor layer;
trenches formed through the third semiconductor layer down to the second semiconductor layer to divide the third semiconductor layer into multiple semiconductor regions;

fourth semiconductor layers of the second conductivity type selectively formed at least in the surface portions of some of the semiconductor regions;

a control electrode formed in each of the trenches with an insulator film interposed between the control electrodes in the trenches;

a runner on the third semiconductor layer in the active region, in which current flows in the semiconductor device, with an insulator film interposed between the runner and the third semiconductor layer, and the runner being connected electrically to the control electrodes;

a first main electrode on the third and fourth semiconductor layers with an interlayer insulator film interposed between the first main electrode and the third and fourth semiconductor layers, the first main electrode being in contact with the third semiconductor layer and the fourth semiconductor layers in the semiconductor regions that have the fourth semiconductor layers formed therein, through the interlayer insulator film, and the first main electrode being in contact with the third semiconductor layer in some of the semiconductor regions that do not include any fourth semiconductor layer, via contact holes formed in the vicinities of the terminal ends of the trenches and in the vicinities of the runner through the interlayer insulator film; and a second main electrode connected electrically to the first semiconductor layer.

2. The insulated gate semiconductor device according to claim 1, additionally comprising semiconductor regions that do not include any fourth semiconductor layer and that are insulated from the first main electrode by the interlayer insulator film.

3. The insulated gate semiconductor device according to claim 2, comprising a number N1 of semiconductor regions which are in contact with the first main electrode but which do not include any fourth semiconductor layer and a number N2 of semiconductor regions which do not include any fourth semiconductor layer and which are insulated from the first main electrode.

4. The insulated gate semiconductor device according to claim 3, wherein N1 and N2 are related according to the expression $$0.25 \leq (N1/(N1+N2)) \leq 0.75.$$

5. An insulated gate semiconductor device comprising:
a first semiconductor layer of a first conductivity type;
a second semiconductor layer of a second conductivity type on the first semiconductor layer;
a third semiconductor layer of the first conductivity type on the second semiconductor layer;

trenches formed through the third semiconductor layer down to the second semiconductor layer to divide the third semiconductor layer into at least first semiconductor regions, second semiconductor regions, and third semiconductor regions;

fourth semiconductor layers of the second conductivity type selectively formed at least in the surface portions of the first semiconductor regions;

a control electrode formed in each of the trenches with an insulator film interposed between the control electrodes in the trenches;

a runner on the third semiconductor layer in the active region, in which current flows in the semiconductor device, with an insulator film interposed between the runner and the third semiconductor layer, and the runner being connected electrically to the control electrodes;

a first main electrode on the third and fourth semiconductor layers with an interlayer insulator film interposed between the first main electrode and the third and fourth semiconductor layers, the first main electrode being in contact through the interlayer insulator film with the third semiconductor layer and the fourth semiconductor layers in the first semiconductor regions, the first main electrode being in contact with the third semiconductor layer only via contact holes formed through the interlayer insulator film in the second semiconductor regions, the contact holes being formed in the vicinities of the terminal ends of the trenches and in the vicinities of the runner;

the first main electrode being insulated from the third semiconductor layer and the fourth semiconductor layers by the interlayer insulator film in the third semiconductor regions; and a second main electrode connected electrically to the first semiconductor layer.

6. The insulated gate semiconductor device according to claim 5, comprising a number N1 of second semiconductor regions and a number N2 of third semiconductor regions wherein N1 and N2 are related by the expression $$0.25 \leq (N1/(N1+N2)) \leq 0.75.$$

* * * * *